(12) United States Patent
Liao et al.

(10) Patent No.: US 10,177,128 B2
(45) Date of Patent: Jan. 8, 2019

(54) SEMICONDUCTOR DEVICE INCLUDING SUPPORT PILLARS ON SOLDER MASK

(71) Applicant: SanDisk Technologies Inc., Plano, TX (US)

(72) Inventors: Chih Chin Liao, Yuanlin Town (TW); Sung Tan Shih, Taichung (TW); Suresh Kumar Upadhyayula, San Jose, CA (US); Ning Ye, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/676,628

(22) Filed: Apr. 1, 2015

(65) Prior Publication Data

US 2016/0293560 A1    Oct. 6, 2016

(51) Int. Cl.
| | |
|---|---|
| *H01L 23/00* | (2006.01) |
| *H01L 25/18* | (2006.01) |
| *H01L 23/498* | (2006.01) |
| *H01L 21/48* | (2006.01) |

(52) U.S. Cl.
CPC .......... *H01L 25/18* (2013.01); *H01L 21/4853* (2013.01); *H01L 23/49816* (2013.01); *H01L 23/49838* (2013.01); *H01L 2224/16238* (2013.01); *H01L 2224/32225* (2013.01); *H01L 2224/48145* (2013.01); *H01L 2224/48228* (2013.01); *H01L 2224/49173* (2013.01); *H01L 2224/73265* (2013.01); *H01L 2924/15321* (2013.01); *H01L 2924/15331* (2013.01); *H01L 2924/351* (2013.01)

(58) Field of Classification Search
None
See application file for complete search history.

(56) References Cited

U.S. PATENT DOCUMENTS

| | | | |
|---|---|---|---|
| 2014/0167254 A1* | 6/2014 | Yu | ............................. H01L 24/13 257/737 |
| 2015/0187745 A1* | 7/2015 | Chiu | ........................ H01L 25/18 257/738 |
| 2016/0005707 A1* | 1/2016 | Kwon | ...................... H01L 24/17 257/737 |

OTHER PUBLICATIONS

Machine-translated English language translation of Korean Unexamined Patent Application 10-2014-0082448.*

* cited by examiner

*Primary Examiner* — Robert Carpenter
(74) *Attorney, Agent, or Firm* — Vierra Magen Marcus LLP (57) ABSTRACT

A semiconductor device, and a method of its manufacture, are disclosed. The semiconductor device includes a substrate having a solder mask. A plurality of pillar bases are formed on the solder mask, and a plurality of solder pillars are applied to the pillar bases. The plurality of solder pillars support one or more semiconductor die above the substrate and the number of solder pillars prevent stresses in the one or more semiconductor die which could otherwise damage the semiconductor die.

17 Claims, 11 Drawing Sheets

SEMICONDUCTOR DEVICE INCLUDING SUPPORT PILLARS ON SOLDER MASK

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While many varied packaging configurations are known, flash memory storage cards may in general be fabricated as system-in-a-package (SiP) or multichip modules (MCM), where a plurality of die are mounted and interconnected on a small footprint substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a molding compound which provides a protective package.

Figure 1:
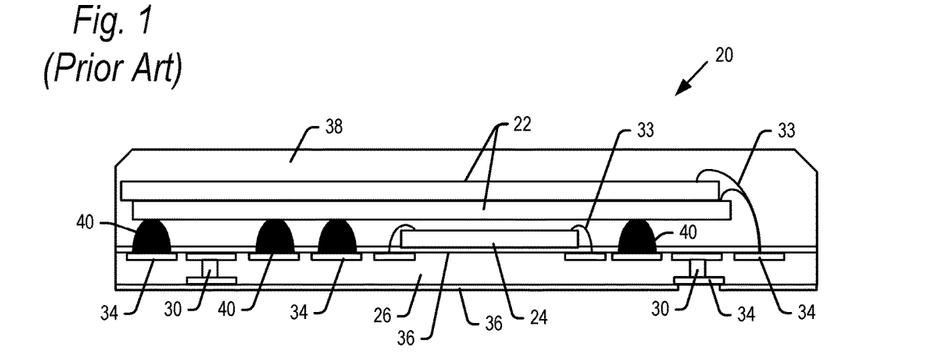
FIG. 1 is a prior art edge view of a conventional semiconductor device including solder balls and contact pads on the substrate support memory die over a controller die.

A cross-sectional side view of a conventional semiconductor package 20 is shown in FIG. 1. Typical packages include a plurality of semiconductor die, such as flash memory die 22 and a controller die 24, supported on a substrate 26. Substrate 26 includes vias 30, electrical traces 32 and contact pads 34 for transferring signals between the semiconductor die 22, 24 and a host device in which the package is located. A solder mask layer 36 (omitted from FIG. 2 for clarity) may be applied to the top and bottom surfaces of the substrate 26. Die bond pads (not shown) may be formed on a surface of the semiconductor die 22, 24 to electrically couple the semiconductor die to the substrate by affixing wire bonds 33 between respective die bond pads and contact pads 34. Once all electrical connections are made, the die and wire bonds may be encapsulated in a molding compound 38 to seal the package and protect the die and wire bonds.

Although the controller die 24 is typically smaller than the memory die 22, it is known to mount the controller die directly to the substrate, for example given the large number of electrical connections between the controller die and the substrate. In such a configuration, the memory die 22 need to be supported above the substrate 26 and controller die 24. One known technique is to apply solder balls 40 on certain substrate contact pads 30, exposed through the solder mask layer 36, and then support the memory die 22 on the solder balls.

Figure 2:
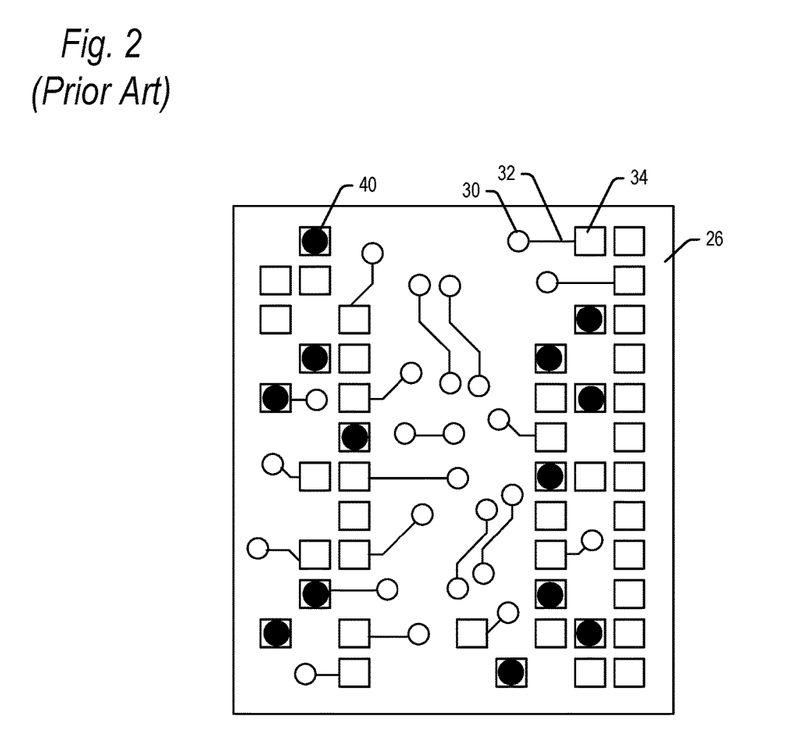
FIG. 2 is a prior art top view of solder balls on contact pads on the substrate.

One drawback to such a technique is that the surface of the substrate 26 is taken up with vias 30, traces 32 and contact pads 34, all used for electrical connections to and from the substrate. FIG. 2 is a top view of a substrate 26 including a configuration of vias 30, traces 32, contact pads 34 and solder balls 40. A large number of contact pads 34 have wire bond connections (not shown in FIG. 2), and therefore cannot take solder balls 40. The vias 30 and traces 32 also take up space which could otherwise be used for solder balls. Consequently, not enough solder balls are provided on the substrate, and stress points develop in the memory die 22, for example during the high pressure molding compound encapsulation process. These stress points can crack or otherwise damage the memory die 22, especially given the extremely thin profile of current memory die.

DETAILED DESCRIPTION

The present technology will now be described with reference to the figures, which in embodiments, relate to a semiconductor device including solder pillars for supporting one or more semiconductor die at a height above the substrate. The solder pillars may be formed directly on a solder mask layer of the device, thus allowing a large number of solder pillars to be provided while not interfering with electrical connections on the substrate.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal" as may be used herein are by way of example and illustrative purposes only, and are not meant to limit the description of the invention inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.25%.

An embodiment of the present invention will now be explained with reference to the flowchart of FIGS. 3, 12 and 13, and the views of FIGS. 4-11 and 14A-19. Although the figures show an individual semiconductor device 100, or a portion thereof, it is understood that the device 100 may be batch processed along with a plurality of other devices 100 on a substrate panel to achieve economies of scale. The number of rows and columns of semiconductor devices 100 on the substrate panel may vary.

Figure 3:
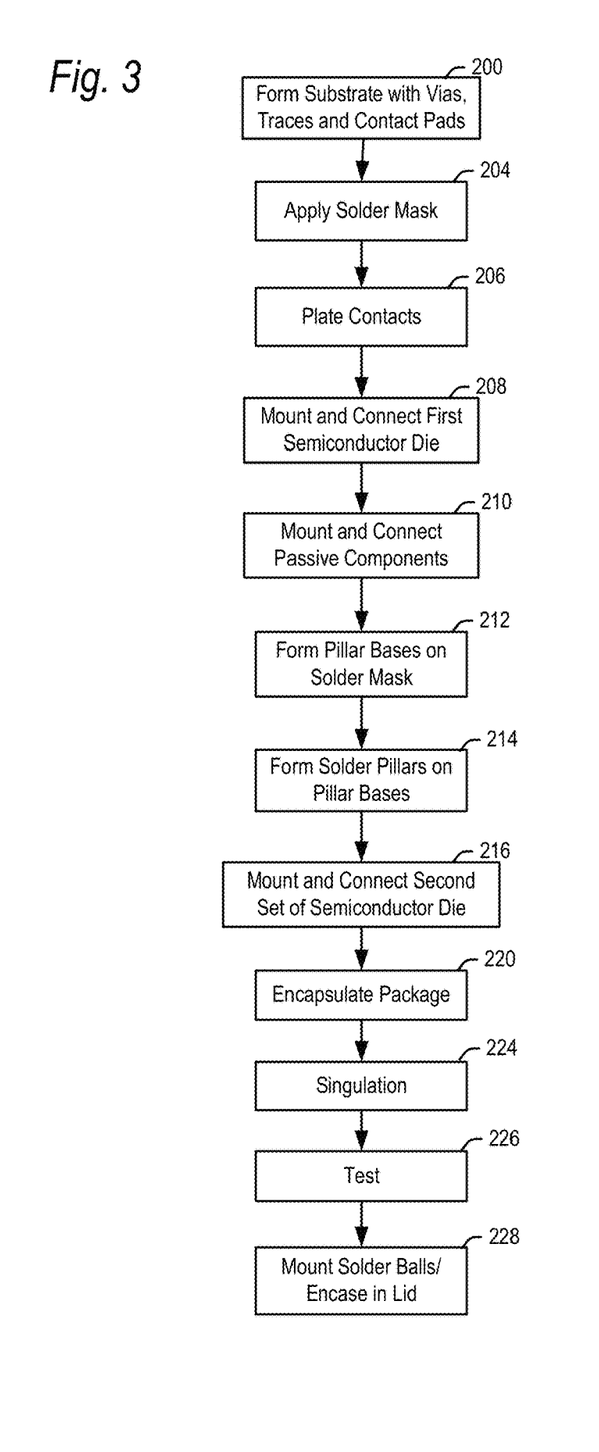
FIG. 3 is a flowchart for forming a semiconductor die according to embodiments of the present invention.
Figure 4:
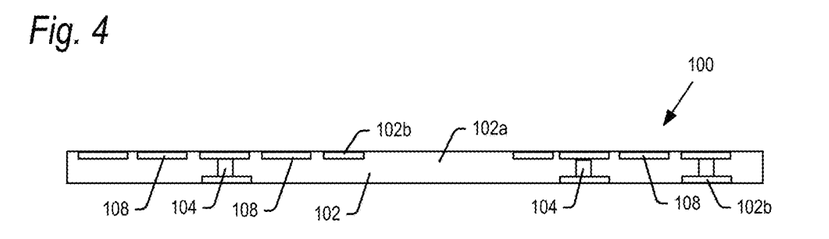
FIG. 4 is a cross-sectional edge view of a semiconductor device in a stage in the fabrication process according to embodiments of the present technology.
Figure 5:
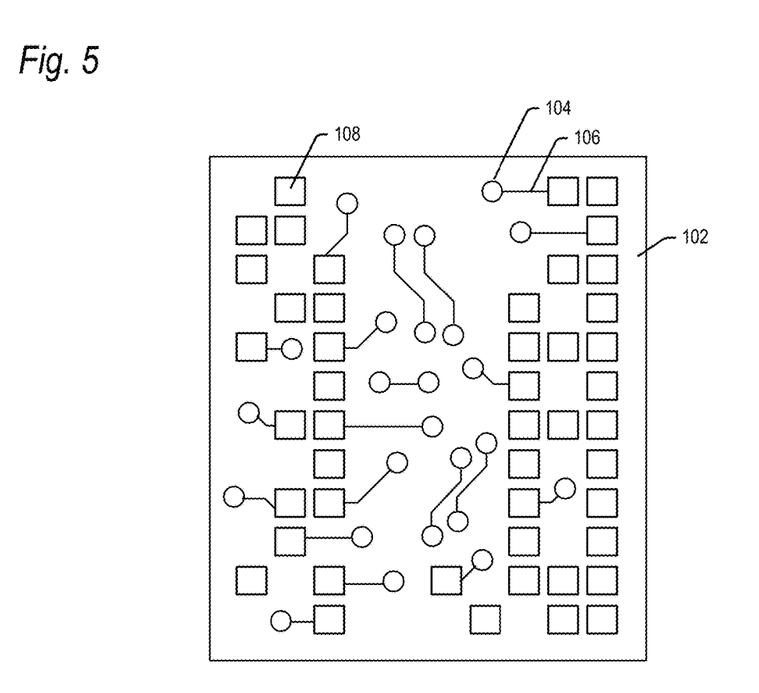
FIG. 5 is a top view of the semiconductor device of FIG. 4.

The substrate panel may begin with a plurality of substrates 102 (again, one such substrate is shown in FIGS. 4-5 for example). The substrate 102 may be a variety of different chip carrier mediums, including a printed circuit board (PCB), a leadframe or a tape automated bonded (TAB) tape. Referring now to the flowchart of FIG. 3 and the views of FIGS. 4 and 5, the substrate 102 may formed in step 200 with a plurality of vias 104, electrical traces 106 and contact pads 108. It is understood that the number and particular configuration of vias 104, traces 106 and pads 108 shown in the figures (only some of which are numbered in the figures) is by way of example only, and they each may be different in further embodiments. For example, the substrate 102 may include many more vias 104, traces 106 and pads 108. Additionally, the substrate 102 is shown with a single dielectric core 102a sandwiched between metal (e.g., copper) layers 102b. It is understood that substrate 102 may include several layers of dielectric sandwiched between metal layers, which layers are connected by vias 104 therebetween.

Figure 6:
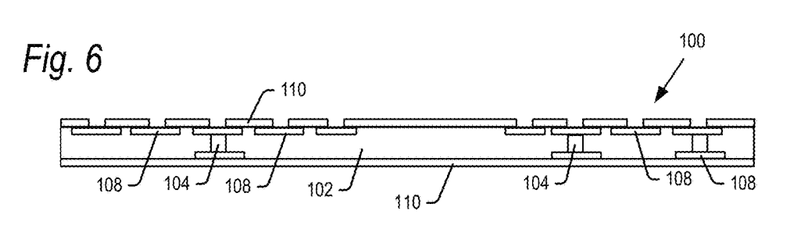
FIG. 6 is a cross-sectional edge view of a semiconductor device in a further stage in the fabrication process according to embodiments of the present technology.
Figure 7:
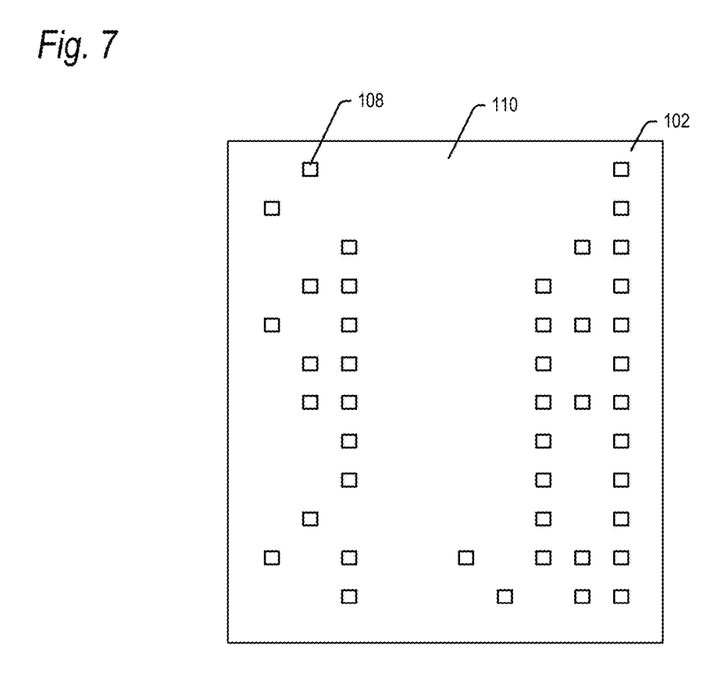
FIG. 7 is a top view of the semiconductor device of FIG. 6.

In step 204, a solder mask layer 110 may be applied to the substrate 102 as shown in FIGS. 6 and 7, leaving the contact pads 108 left exposed. The solder mask 110 is a layer of polymer that provides a protective coating for the vias 104 and electrical traces 106 and prevents solder from bleeding beyond the exposed contact pads 108, thereby preventing short circuits. Before or after the solder mask 110 is formed, a plating process may be performed in step 206 to plate the contact pads 108 in order to receive wire bonds thereon. The pads 108 may be plated with thin layer of Nickel-Gold (Ni/Au) or the like in a known electrolytic plating process, electroless plating process or thin film deposition process.

Figure 8:
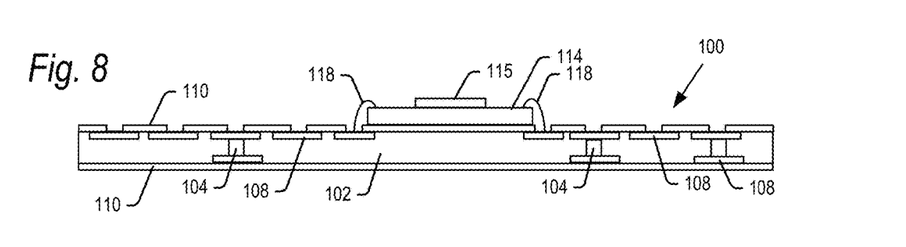
FIG. 8 is a cross-sectional edge view of a semiconductor device in a still further stage in the fabrication process according to embodiments of the present technology.
Figure 9:
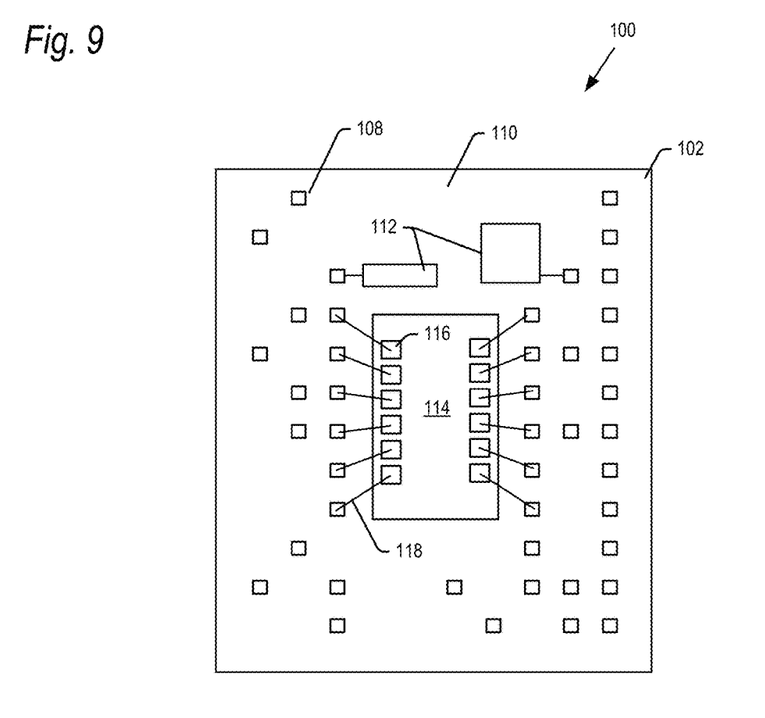
FIG. 9 is a top view of the semiconductor device of FIG. 8.

In step 208, a semiconductor die 114 may be mounted on a surface of the substrate 102. The semiconductor die 114 may be a controller ASIC. However, die 114 may be other types of semiconductor die, such as a DRAM or NAND. FIGS. 8 and 9 show the semiconductor die 114 mounted on the substrate 102. The semiconductor die 114 includes die bond pads 116, one of which is labeled for example in FIG. 9. The die bond pads 116 may be electrically coupled to contact pads 108 on the substrate 102 via wire bonds 118 in a known wire bond process in step 208 using for example a wire bond capillary (not shown). It is understood that the semiconductor die 114 may be electrically coupled to the substrate 102 using other technologies. For example, semiconductor die 114 may be a flip-chip which is soldered onto contact pads of the substrate 102. As a further example, conductive leads may be printed by known printing processes between the die bond pads and contact pads to electrically couple the semiconductor die 114 to the substrate 102.

The number of die bond pads 116 and wire bonds 118 shown is for clarity only, and it is understood that there may be more contact pads 108, die bond pads 116 and wire bonds 118 in further embodiments. Moreover, while semiconductor die 114 is shown with die bond pads and wire bonds on only two sides in FIG. 9, it is understood that semiconductor die 114 may alternatively have die bond pads 116 and wire bonds 118 on one side, three sides or all four sides in further examples. In some embodiments, a spacer layer 115 (FIG. 8) formed of a dielectric material may be provided on an upper surface of the semiconductor die 114 to support a second group of semiconductor die 140 (explained hereinafter) above the die 114.

Passive components 112 may be affixed to the substrate 102 in a step 210. The one or more passive components may include for example one or more capacitors, resistors and/or inductors, though other components are contemplated. The passive components 112 shown are by way of example only, and the number, type and position may vary in further embodiments. In embodiments, the passive components may fit between the substrate 102 and semiconductor die 140 (explained below), in a space created by the solder pillars (explained below). In such an embodiment, the passive components 112 may extend above the surface of the substrate 102, but have a height that is lower than the solder pillars. In further embodiments, the passive components may be mounted on the substrate 102 outside of a footprint of the semiconductor die 140. In such an embodiment, the passive components 112 may extend above the surface of the substrate 102 to a height that is higher or lower than the solder pillars.

Figure 10:
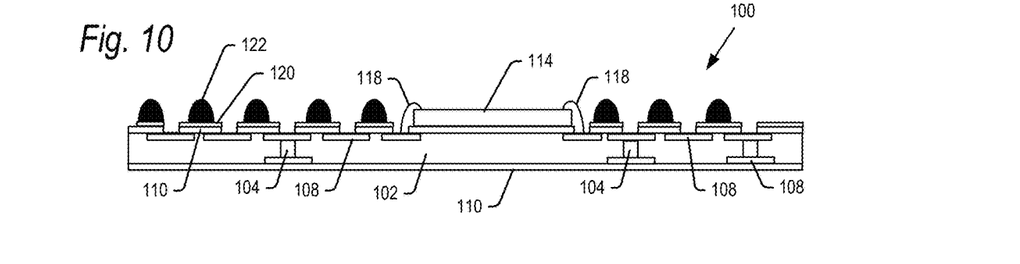
FIG. 10 is a cross-sectional edge view of a semiconductor device in another stage in the fabrication process according to embodiments of the present technology.
Figure 11:
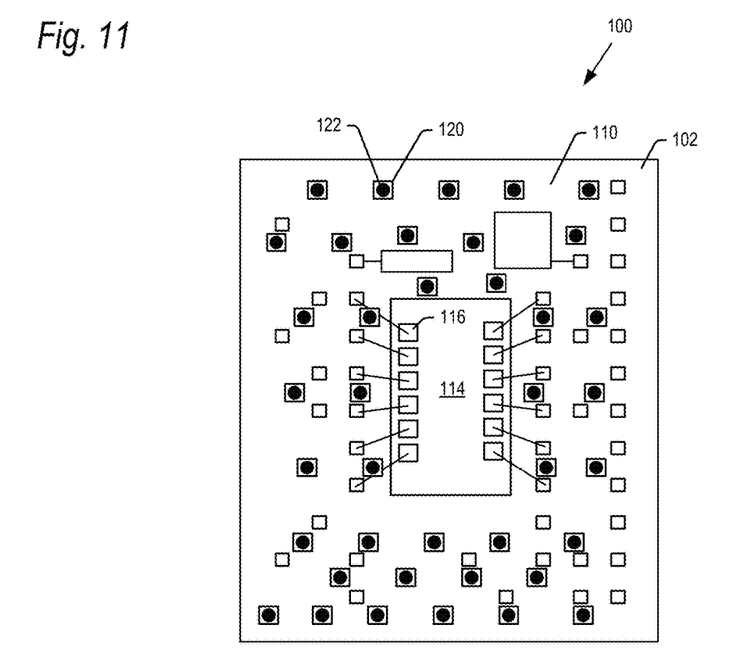
FIG. 11 is a top view of the semiconductor device of FIG. 10.

In accordance with aspects of the present technology, as seen for example in FIGS. 10 and 11, pillar bases 120 may be formed on top of the solder mask layer 110 in step 212. Once the pillar bases 120 are formed, solder pillars 122 may be applied to the pillar bases 120 in step 214. In embodiments, the pillar bases 120 may have a diameter of about 300 µm, though the diameter may be higher or lower than this in further embodiments. Further details of step 212 for forming the pillar bases 120 will now be explained with reference to the flowcharts of FIGS. 12 and 13.

Figure 12:
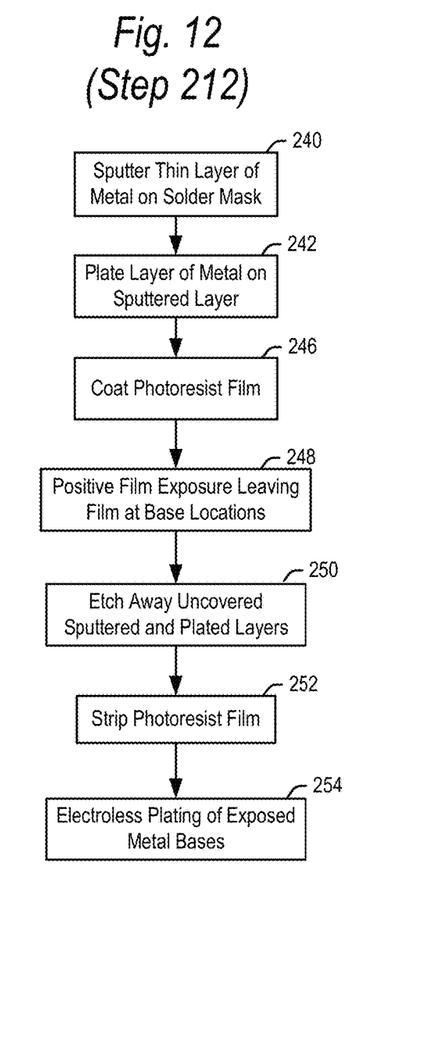
FIG. 12 is a flowchart providing further detail of step 212 for forming the pillar base according to an embodiment of the present technology.

The flowchart of FIG. 12, and the accompanying illustrations of FIGS. 14A-14G, show the formation of the pillar base 120 according to an electroless plating process. FIGS. 14A-14G show the substrate 102 and the solder mask 110 on bottom and top surfaces of the substrate 102. The layers described below used to form the pillar base 120 are shown in the figures for clarity and are not drawn to scale. In step 240, a thin layer of metal 130 is sputtered onto an exposed surface of one of the layers (e.g., top) of solder mask 110. In embodiments, sputtered layer 130 may be 1 to 3 μm, though it may be thinner or thicker than that in further embodiments. The metal layer 130 may be deposited across the entire surface of the solder mask 110 (including into the openings in the solder mask 110 for contact pads 108. The metal layer 130 may for example be Cu, but the metal layer 130 may be other metals in further embodiments. It is also understood that the metal layer 130 may be deposited on the solder mask layer 110 by thin deposition processes other than sputtering.

Figure 14A:
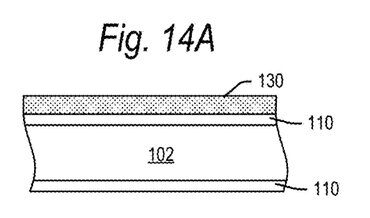
FIGS. 14A-14G illustrate the pillar base in the various fabrication steps of FIG. 12.
Figure 14B:
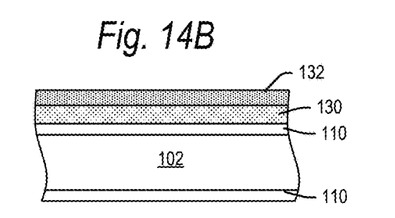
Figure 14C:
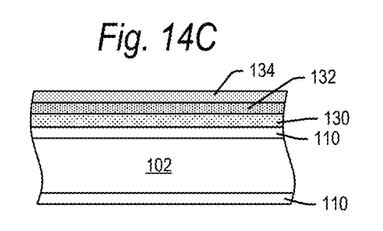
Figure 14D:
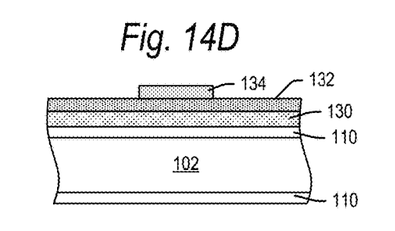

In step 242, a second layer of metal 132 may be formed on top of the first layer of metal 130 as shown in FIG. 14B. The second layer of metal 132, which may be Cu or other metal, may for example be plated onto the first layer of metal 130, and may have a thickness of about 5 μm, though it may be thinner or thicker than that in further embodiments. The second layer of metal 132 may be omitted in further embodiments of the present technology. In step 246, a photoresist film 134 may be coated over the second layer of metal 132 as shown in FIG. 14C, for example in a known spin coating process. In step 248, the photoresist film 134 may be exposed using a positive mask, and unexposed portions removed, so as to leave photoresist 134 behind on the second layer of metal 132 in the shapes and positions of the final pillar bases 120 as shown in FIG. 14D.

Figure 14E:
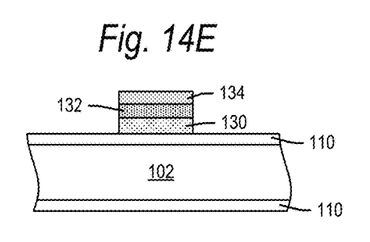
Figure 14F:
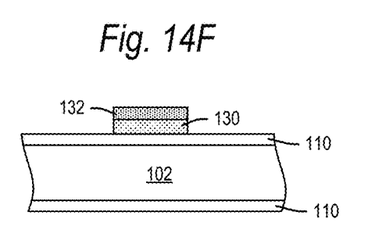
Figure 14G:
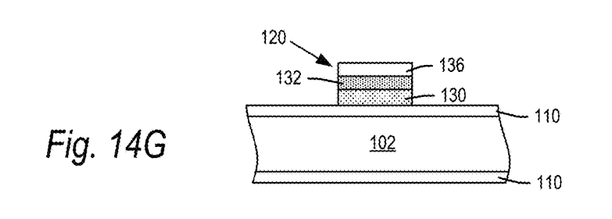

In step 250, the exposed first and second layers of metal 130, 132 (i.e., those areas not covered by photoresist) are etched away as shown in FIG. 14E. In step 252, the remaining photoresist 134 may be stripped away as shown in FIG. 14F, leaving only the first and second metal layers 130, 132 in the shapes and positions of the pillar bases 120. Thereafter, in step 254, the exposed second metal layer 132 may be plated with a layer 136 of for example Ni/Au as shown in FIG. 14G to form the finished pillar bases 120. The plated layer 136 may for example be 5-10 μm, though it may be thinner or thicker than that in further embodiments. It is understood that the steps shown in FIG. 12, and the components shown in FIGS. 14A-14G, may be varied in accordance with known electroless plating processes to form the pillar bases 120.

Figure 13:
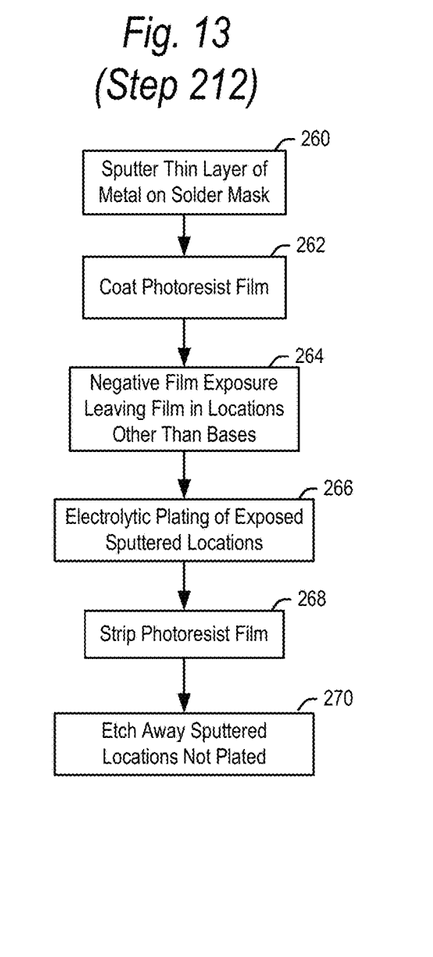
FIG. 13 is a flowchart providing further detail of step 212 for forming the pillar base according to an alternative embodiment of the present technology.

The flowchart of FIG. 13, and the accompanying illustrations of FIGS. 15A-15F, show the formation of the pillar base 120 according to an electrolytic plating process. FIGS. 15A-15F show the substrate 102 and the solder mask 110 on bottom and top surfaces of the substrate 102. In step 260, a thin layer of metal 130 is sputtered onto an exposed surface of one of the layers (e.g., top) of solder mask 110. The metal layer 130 may be deposited across the entire surface of the solder mask 110. As above, the metal layer 130 may for example be Cu, but the metal layer 130 may be other metals in further embodiments. It is also understood that the metal layer 130 may be deposited on the solder mask layer 110 by thin deposition processes other than sputtering.

Figure 15A:
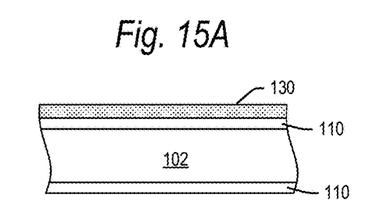
FIGS. 15A-15F illustrate the pillar base in the various fabrication steps of FIG. 13.
Figure 15B:
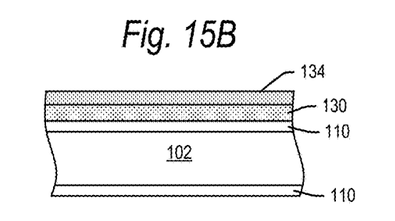
Figure 15C:
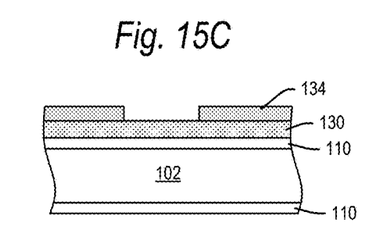

In step 262, a photoresist film 134 may be coated over the layer of metal 130 as shown in FIG. 15B, for example in a known spin coating process. In step 264, the photoresist film 134 may be exposed using a negative mask, and unexposed portions removed, so as to leave photoresist behind on the layer of metal 130 in all areas other than the areas where the final pillar bases 120 are to be formed as shown in FIG. 15C. Thus, the areas of the metal layer 130 exposed through the photoresist 134 are in the shapes and positions of the final pillar bases 120.

Figure 15D:
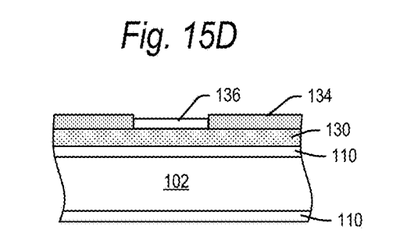
Figure 15E:
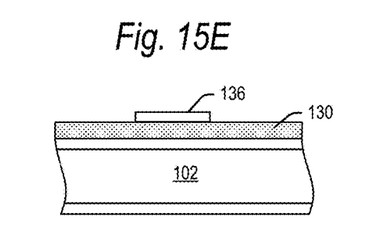
Figure 15F:
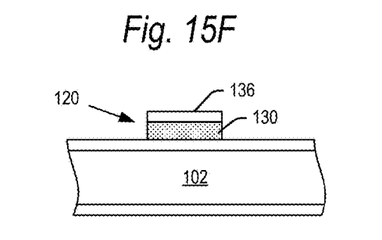

In step 266, the exposed areas of the metal layer 130 may be plated with a layer 136 of for example Ni/Au as shown in FIG. 15D in an electrolytic plating process. In step 268, the remaining photoresist 134 may be stripped away as shown in FIG. 15E. Thereafter, in step 270, the exposed areas of the metal layer 130 (those areas not covered by plated layer 136) may be etched away as shown in FIG. 15F to form the finished pillar bases 120. The thicknesses of the respective layers may be as described above with respect to FIG. 12. It is understood that the steps shown in FIG. 13, and the components shown in FIGS. 15A-15F, may be varied in accordance with known electrolytic plating processes to form the pillar bases 120.

Referring again to the flowchart of FIG. 3, once the pillar bases 120 are formed on a surface of solder mask 110 in step 212, solder pillars 122 may be applied to the pillar bases 120 in step 214 as shown in FIGS. 10 and 12. In embodiments, a stencil (not shown) having holes conforming to the positions of the pillar bases 120 may be placed on top of the solder mask 110 and pillar bases 120. Thereafter, A-stage or B-stage solder paste may be spread over the stencil using for example a brush or squeegee-type device so that solder paste is applied into each of the holes of the stencil, onto respective pillar bases 120. Thereafter, the stencil may be removed and the solder paste may be hardened to a firm C-stage in a reflow process, to form the finished solder pillars 122. In embodiments, the reflow process may be performed at 260° C. (peak temperature) for about 10 minutes. Both the temperature and time period may vary in further embodiments. Additionally, in further embodiments, the one or more semiconductor die 140 (explained below) may applied to the solder pillars prior to the reflow process.

The number and positions of pillar bases 120 and solder pillars 122 thereon may vary in different embodiments of the present technology. The layout of the substrate, including the positions of contact pads 108, is known. Thus, the positions of the openings in the solder mask 110 over the contact pads 108 is also known. The areas on the solder mask having components such as passive components 112 and semiconductor die 114 is also known. As described above with respect to FIGS. 12 and 13, the locations of the pillar bases 120 are determined by the photoresist masks. Knowing the positions of the holes in the solder mask 110 and components on the solder mask 110, the photoresist masks may be configured to form pillar bases 120 on any or all areas of the solder mask 110 not having exposed holes or components. Thereafter, the stencil may be configured to deposit solder pillars 122 on some or all of the pillar bases 120. This number of pillar bases 120 and solder pillars 122 is not constrained by the vias 104 or traces 106 on the substrate 102. Additionally, the number of pillar bases 120 and solder pillars 122 is sufficient to adequately support the semiconductor die 140 (explained below) without stresses which could otherwise damage the die 140.

The solder pillars may be formed of an electrically conductive solder material such as Sn/Ag, SAC, Sn/Bi, Sn/Sb, and other alloys. In further embodiments, the solder pillars may be formed of electrically inactive materials. The solder pillars may rest against an electrically inactive surface of the one or more semiconductor die 140 (described below), though the surface against which the solder pillars rest may be electrically active in further embodiments. In embodiments, the solder pillars may be about 80 to 140 μm, and have a diameter at their base of about 275 to 325 μm, though these dimensions may vary above and below these values in further embodiments.

Figure 16:
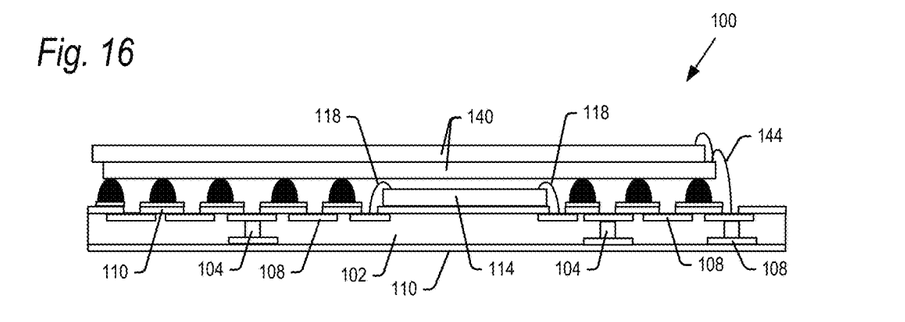
FIG. 16 is a cross-sectional edge view of a semiconductor device in a further stage in the fabrication process according to embodiments of the present technology.
Figure 17:
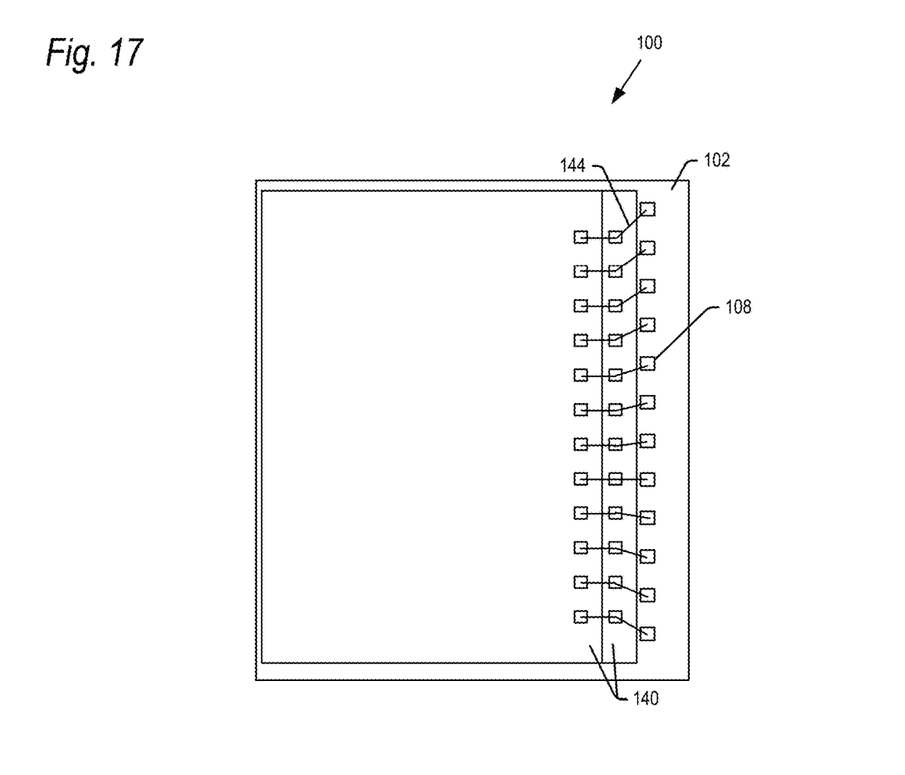
FIG. 17 is a top view of the semiconductor device of FIG. 16.

Referring again to the flowchart of FIG. 3 and the edge and top views of FIGS. 16 and 17, a second group of one or more semiconductor die 140 may be stacked on top of the solder pillars 122 in step 216. As noted, given the large number of solder pillars 122, the semiconductor die 140 may be supported on the pillars 122 at enough positions to prevent any appreciable stress on the semiconductor die 140.

As shown in FIG. 16, the semiconductor die 140 may be stacked in stepped configuration. While two such semiconductor die 140 are shown, there may be a single semiconductor die 140 or more than two semiconductor die in the die stack in further embodiments. Semiconductor die 140 may for example be memory die, for example NAND flash memory die, but other types of semiconductor die are contemplated. Die bond pads 142 on the semiconductor die 140 may be wire bonded to contact pads 108 on the substrate 102 via wire bonds 144 in a known wire bonding process, using for example a wire bond capillary (not shown). While wire bonds are shown off of a single edge of the semiconductor die 140, it is understood that wire bonds may be formed around two or more edges of semiconductor die 140 in further embodiments.

Figure 18:
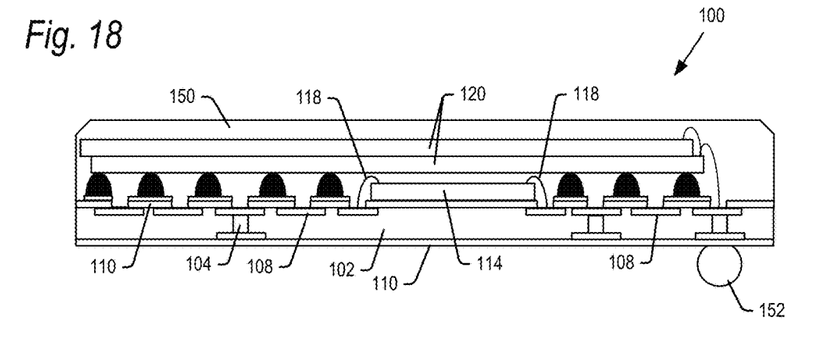
FIG. 18 is a cross-sectional edge view of a semiconductor device in another stage in the fabrication process according to embodiments of the present technology.
Figure 19:
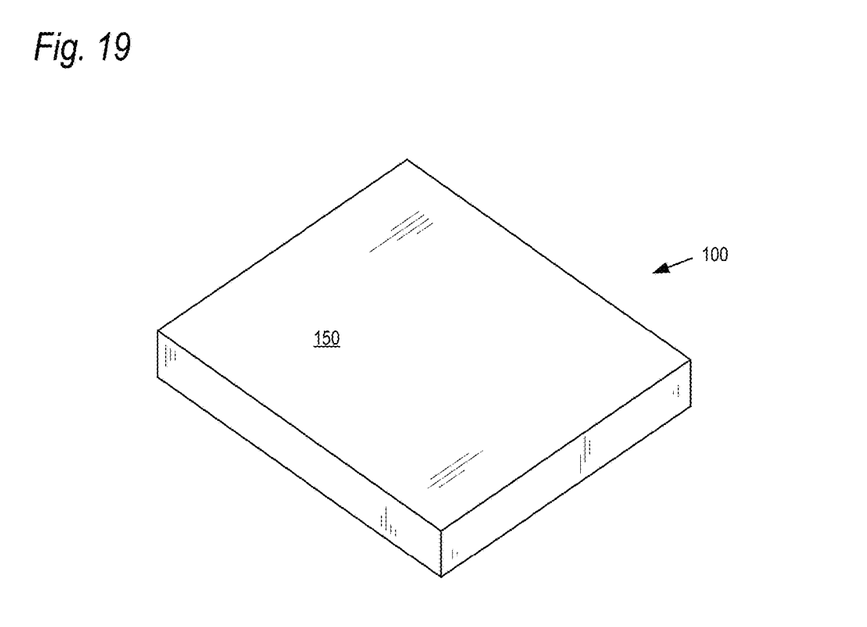
FIG. 19 is a perspective view of the semiconductor device of FIG. 17.

After the die stack is formed and wire bonded to contact pads 108 on the substrate 102, the semiconductor device 100 may be encased within the molding compound 150 in step 220, and singulated from the panel in step 224, to form a finished semiconductor device 100 as shown in FIGS. 18 and 19. Molding compound 150 may be a known epoxy such as for example available from Sumitomo Corp. and Nitto Denko Corp., both having headquarters in Japan. Thereafter, the device 100 may undergo electrical test and burn-in in step 226. In some embodiments where device 100 is to be used as an embedded BGA package, solder balls 152 (one of which is shown in FIG. 18) may be affixed to contact pads 108 in step 228 on a bottom surface of the substrate 102 (i.e., on a side of the substrate 102 opposite the solder pillars 122). In some embodiments where device 100 is used as an LGA package, the solder balls 152 may be omitted and the semiconductor device 100 may optionally be enclosed within a lid (not shown) in step 228.

In embodiments described above, the solder pillars 122 are provided to support one or more semiconductor die 140 over the substrate 102 so that a smaller semiconductor die 114 may be mounted directly to the substrate 102 beneath the one or more semiconductor die 140. However, in further embodiments, it is understood that the semiconductor die 114 may be omitted. In such embodiments, the solder pillars 122 may be provided to support the one or more semiconductor die 140 over the substrate 102 so that any component may be placed on the substrate 102 beneath the one or more semiconductor die 140. Such components may include passive components, electrical conductors or connectors and other components which may be mounted or otherwise provided on substrate 102.

Additionally, while embodiments described above show a single component (e.g., a single semiconductor die 114) in the space between the substrate 102 and the group of one or more semiconductor die 140, it is understood that a plurality of components may be provided in that space. Such plurality of components include for example a plurality of semiconductor die, including one or more controller die, one or more flash memory die and/or one or more DRAM. Such plurality of components may also include for example one or more semiconductor die and components other than semiconductor die.

In summary, an example of the present technology relates to a substrate for a semiconductor device having semiconductor die, the substrate comprising: a plurality of contact pads for receiving electrical connections from the semiconductor die; a solder mask formed on a surface of the substrate including the contact pads, and having openings corresponding to positions of the plurality of contact pads; a plurality of pillar bases formed on an exposed surface of the solder mask; and a plurality of solder pillars formed on the plurality of pillar bases, the plurality of solder pillars provided to support one or more of the semiconductor die over the substrate.

In a further example, the present technology relates to a semiconductor device, comprising: semiconductor device, comprising: a substrate comprising a plurality of contact pads; a solder mask formed on a surface of the substrate including the contact pads; a plurality of pillar bases formed on an exposed surface of the solder mask, a pillar base of the plurality of pillar bases including one or more metal layers; a plurality of solder pillars formed on the plurality of pillar bases; a group of one or more semiconductor die electrically coupled the plurality of contact pads, and supported over the substrate on the plurality of solder pillars.

In another example, the present technology relates to a method of forming a semiconductor device, comprising: (a) defining a plurality of contact pads on a substrate; (b) applying a solder mask on a surface of the substrate including the contact pads; (c) forming a plurality of pillar bases on an exposed surface of the solder mask; (d) applying a plurality of solder pillars on the plurality of pillar bases; and (e) supporting a group of one or more semiconductor die electrically on the plurality of solder pillars.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A chip carrier medium for a semiconductor device having semiconductor die including integrated circuits, the chip carrier medium configured to carry the semiconductor die and transfer signals to and from the semiconductor die, the chip carrier medium comprising:
   a plurality of contact pads having contact pad surfaces exposed at a surface of the chip carrier medium, the contact pad surfaces configured to receive electrical connections from the semiconductor die;
   a solder mask formed on a surface of the chip carrier medium including the contact pads, and having openings corresponding to positions of the plurality of contact pads;
   a plurality of pillar bases formed on an exposed surface of the solder mask; and
   a plurality of solder pillars formed on the plurality of pillar bases, the plurality of solder pillars provided to engage an inactive surface of one of the semiconductor die and support one or more of the semiconductor die over the chip carrier medium.

2. The chip carrier medium of claim 1, wherein the plurality of pillar bases comprise at least a first layer of metal.

3. The chip carrier medium of claim 2, wherein the at least a first layer of metal comprises a layer of metal deposited on the exposed surface of the solder mask.

4. The chip carrier medium of claim 2, wherein the at least a first layer of metal comprises a first layer of metal deposited on the exposed surface of the solder mask, and a second layer of metal plated on the at least first layer of metal.

5. The chip carrier medium of claim 2, wherein the at least a first layer of metal comprises a first layer of copper and a second layer of copper formed on the first layer of copper.

6. The chip carrier medium of claim 2, wherein the at least a first layer of metal comprises at least a first layer of copper and a second layer of nickel-gold formed on the at least first layer of copper.

7. A semiconductor device, comprising:
- a chip carrier medium comprising a plurality of contact pads, the chip carrier medium configured to carry semiconductor die and transfer signals to and from the semiconductor die;
- a solder mask formed on a surface of the chip carrier medium including the contact pads;
- a first semiconductor die mounted to the chip carrier medium, the semiconductor die including integrated circuits;
- a group of one or more semiconductor die supported over the chip carrier medium and first semiconductor die, and electrically coupled the plurality of contact pads, the semiconductor die in the group of one or more semiconductor die including integrated circuits; and
- a plurality of solder pillars configured to support the group of one or more semiconductor die spaced from the first semiconductor die; and
- a plurality of pillar bases formed on an exposed surface of the solder mask, a pillar base of the plurality of pillar bases including one or more metal layers, the plurality of pillar bases supporting the plurality of solder pillars on the chip carrier medium.

8. The semiconductor device of claim 7, wherein the group of one or more semiconductor die comprise one or more flash memory die.

9. The semiconductor device of claim 7, further comprising one or more components mounted on the chip carrier medium, in a space between the chip carrier medium and bottom surface of the one or more semiconductor die.

10. The semiconductor device of claim 9, wherein the group of one or more semiconductor die comprise a first group of one or more semiconductor die, and wherein the one or more components comprise a second group of one or more semiconductor die.

11. The semiconductor device of claim 10, wherein the second group of one or more semiconductor die comprise a controller die.

12. The semiconductor device of claim 9, wherein the one or more components comprise one or more passive components.

13. The semiconductor device of claim 7, wherein the plurality of pillar bases comprise at least a first layer of metal.

14. The semiconductor device of claim 13, wherein the at least a first layer of metal comprises a layer of metal deposited on the exposed surface of the solder mask.

15. The semiconductor device of claim 13, wherein the at least a first layer of metal comprises a first layer of metal deposited on the exposed surface of the solder mask, and a second layer of metal plated on the at least first layer of metal.

16. The semiconductor device of claim 13, wherein the at least a first layer of metal comprises a first layer of copper and a second layer of copper formed on the first layer of copper.

17. The semiconductor device of claim 13, wherein the at least a first layer of metal comprises at least a first layer of copper and a second layer of nickel-gold formed on the at least first layer of copper.

* * * * *